United States Patent [19]
Kholodenko et al.

[11] Patent Number: 5,856,906
[45] Date of Patent: Jan. 5, 1999

[54] BACKSIDE GAS QUICK DUMP APPARATUS FOR A SEMICONDUCTOR WAFER PROCESSING SYSTEM

[75] Inventors: Arnold Kholodenko, San Francisco; Maya Shendon, San Carlos; Gary Hsueh, Berkeley; James E. Sammons, III, Santa Clara, all of Calif.

[73] Assignee: Applied Materials, Inc., Santa Clara, Calif.

[21] Appl. No.: 854,509

[22] Filed: May 12, 1997

[51] Int. Cl.$^6$ .................................................. H02N 13/00
[52] U.S. Cl. ........................................... 361/234; 279/128
[58] Field of Search .................................. 361/234, 230, 361/233, 235; 269/8; 279/128

[56] References Cited

U.S. PATENT DOCUMENTS

| | | | |
|---|---|---|---|
| 4,603,466 | 8/1986 | Morley | 29/569 |
| 4,963,713 | 10/1990 | Horiuchi et al. | 219/121.43 |
| 4,980,022 | 12/1990 | Fujimura et al. | 156/643 |
| 5,103,367 | 4/1992 | Horwitz et al. | 361/234 |
| 5,267,607 | 12/1993 | Wada | 165/80.1 |
| 5,310,453 | 5/1994 | Fukusawa et al. | 156/643 |
| 5,547,539 | 8/1996 | Arasawa et al. | 156/345 |
| 5,622,593 | 4/1997 | Arasawa et al. | 156/345 |
| 5,665,166 | 9/1997 | Deguchi et al. | 118/723 E |
| 5,708,556 | 1/1998 | Van Os et al. | 361/234 |

FOREIGN PATENT DOCUMENTS 0 397 315 A2  11/1990  European Pat. Off. ........ H01L 21/00

*Primary Examiner*—Fritz Fleming
*Attorney, Agent, or Firm*—Thomason and Moser

[57] ABSTRACT

Apparatus for retaining a workpiece in a semiconductor wafer processing system. The apparatus has a collector positioned between an electrostatic chuck pedestal and the floor of the processing chamber. The collector has inlet and exhaust control valves connected to inlet and exhaust ports for providing and expelling a backside heat transfer gas (e.g., Helium). Heat transfer exhaust cavities in the collector are connected to the exhaust port to rapidly draw the gas off the backside of the wafer. Additionally, control of the heat transfer gas layer uniformity during processing is achieved by opening and closing the valves to the inlet and exhaust ports as required.

11 Claims, 3 Drawing Sheets

BACKSIDE GAS QUICK DUMP APPARATUS FOR A SEMICONDUCTOR WAFER PROCESSING SYSTEM

BACKGROUND OF THE INVENTION

1. Field of the Invention

The invention relates generally to apparatus for retaining a workpiece in a semiconductor wafer processing system and, more specifically, to an apparatus for controlling heat transfer gas layer uniformity along a bottom surface of the workpiece and eliminating workpiece pop off during dechucking.

2. Description of the Background Art

Electrostatic chucks are used for holding a workpiece in various applications ranging from holding a sheet of paper in a computer graphics plotter to holding a semiconductor wafer within a semiconductor wafer process chamber. Although electrostatic chucks vary in design, they all are based on the principal of applying a voltage to one or more electrodes in the chuck so as to induce opposite polarity charges in the workpiece and electrodes, respectively. The electrostatic attractive force between the opposite charges pulls the workpiece against the chuck, thereby retaining the workpiece.

In semiconductor wafer processing equipment, electrostatic chucks are used for clamping wafers to a pedestal during processing. For example, electrostatic chucks find use in etching, chemical vapor deposition (CVD), and physical vapor deposition (PVD) applications. One type of electrostatic chuck is fabricated using conventional, flexible printed circuit fabrication techniques with materials available from a flexible circuit board manufacturer such as Rogers Corporation of Chandler, Ariz. More specifically, the electrostatic chuck is comprised of a top layer of dielectric material covering a conductive electrode. Below the electrode is a bottom layer of dielectric material. The top and bottom dielectric layers encapsulate the conductive electrode or electrodes. The entire assembly is then adhered to the pedestal. The top layer of dielectric material forms a support surface upon which the workpiece is retained. When a voltage is applied to the electrode, the wafer is referred back to the same ground reference as the voltage source by a conductive connection to the wafer via an electrical conductor or a plasma formed proximate the wafer. As such, an electrostatic force is established between the wafer being clamped and the electrostatic chuck.

The materials and processes used to process a wafer are extremely temperature sensitive. Should these materials be exposed to excessive temperature fluctuations due to poor heat transfer from the wafer during processing, performance of the wafer processing system may be compromised resulting in wafer damage. The aforementioned pedestal forms both a cathode and a heat sink. To optimally transfer heat between the wafer and chuck, a very large electrostatic force is used in an attempt to cause the greatest amount of wafer surface to physically contact the support surface. However, due to surface roughness of both the wafer and the chuck, small interstitial spaces remain between the chuck and wafer that interfere with optimal heat transfer.

To achieve further cooling of the wafer during processing, an inert gas such as Helium is pumped into the interstitial spaces formed between the wafer and the support surface of the chuck. This gas acts as a thermal transfer medium from the wafer to the chuck that has better heat transfer characteristics than the vacuum it replaces. To further enhance the cooling process, the chuck is typically water-cooled via conduits within the pedestal. This cooling technique is known as backside gas cooling.

The backside gas exerts a pressure on the wafer that pushes it away from the support surface. The electrostatic force exerted by the electrostatic chuck is greater than the force created by the gas pressure; therefore, the wafer remains in position during processing. However, the interaction of these two forces may cause random, localized leakage of the heat transfer gas where the edge of the wafer contacts the electrostatic chuck. Leakage of the gas contributes to an undesirable non-uniform temperature condition across the bottom surface of the wafer.

When processing is completed, the wafer must be quickly and accurately removed from the chamber. A wafer is typically "dechucked" by turning off power to the electrostatic chuck. In this way, the electrostatic force is eliminated and the wafer is no longer clamped to the support surface of the pedestal. Lifting and moving mechanisms (i.e., lift pins from beneath the pedestal and/or a robotic arm) can then engage the wafer to remove it from the chamber.

As the electrostatic force is reduced, the heat transfer gas is evacuated from the interstitial spaces between the wafer and the support surface. A vacuum pump connected to the backside gas inlet port is activated to draw the gas from the process chamber, i.e., the path used to supply the gas is used to remove the gas. Gas pressure is thereby reduced, but not necessarily at the same rate that the electrostatic clamping force is reduced. If the force from the evacuating gas is greater than the clamping force, the wafer will pop off the support surface. Once a wafer has moved from its original position, the lift pins or robotic arm may not properly contact the wafer. As a result, the wafer is pushed off the support surface and into an irretrievable position within the process chamber. Contaminating the wafer in this manner results in a total loss of the wafer as a usable product. The wafer may also be scratched by engaging it in an area that has been processed thereby damaging the delicate circuit patterns formed onto its surface.

Existing wafer processing systems and the chucking apparatus they employ are not adequately equipped to eliminate the leakage of heat transfer gas during wafer processing or the dynamic interaction of unequal forces encountered by a wafer during the dechucking process. There are no provisions for the rapid removal of backside gas. As result, wafer pop off continues to be a condition not 1 addressed by the prior art.

Therefore, there is a need in the art for an apparatus that provides greater control of heat transfer gas during wafer processing and quickly removes backside gas from beneath a wafer prior to dechucking the wafer.

SUMMARY OF THE INVENTION

The disadvantages heretofore associated with the prior art are overcome by an inventive apparatus for retaining a workpiece within a semiconductor wafer processing system. The apparatus consists of a pedestal assembly, a collector attached to the pedestal assembly, and a plurality of valves connected to the collector for regulating the uniformity of the gas layer on the backside of the workpiece and for rapidly evacuating the gas layer therefrom. The collector has a number (e.g., four) of heat transfer gas distribution and dual purpose ports. The heat transfer gas distribution ports are connected to a heat transfer medium (e.g., helium) supply via a bore through the collector and a collector inlet port. The dual purpose ports are connected to a vacuum pump via a gas exhaust cavity. The dual purpose ports provide lift pin access to the pedestal surface as well as a path for the heat transfer gas to be exhausted from the wafer backside.

In operation, vacuum pressure draws a heat transfer gas from a supply, through an inlet control valve, collector and pedestal. Gas distribution ports are provided through the pedestal to distribute the heat transfer gas under the backside of a wafer. When processing is completed, an exhaust control valve opens. As the wafer is dechucked, a high vacuum pressure draws the heat transfer gas off the backside of the wafer through the dual purpose ports, a gas exhaust cavity, and the collector. Generally, a chamber turbomolecular pump is coupled to the exhaust control valve to produce the high vacuum that removes the heat transfer gas.

A method of controlling the heat transfer gas layer uniformity across a bottom surface of a wafer in a semiconductor wafer processing system comprises the steps of opening an inlet control valve to introduce the heat transfer gas to the bottom surface of the wafer and closing the inlet control valve to establish an initial heat transfer gas layer. The inlet control valve or an exhaust control valve is then opened to alter heat transfer gas layer uniformity based on a predefined heat transfer gas layer uniformity parameter and then closed to reestablish the heat transfer gas layer. The opening and closing of the valves may be repeated as necessary to maintain the predefined heat transfer gas layer uniformity parameter. The valves can be opened and closed by computer or manual control.

This invention fulfills the long felt need for an apparatus that can rapidly exhaust a heat transfer gas from the underside of the workpiece by using the volume of the gas exhaust cavity as a temporary "quick dump" to reduce backside gas pressure. In this way, the force exerted by the backside gas on the wafer is never greater than the electrostatic clamping force thereby eliminating wafer pop off. Also, the invention provides a method for controlling uniformity of the heat transfer gas layer under the workpiece. Monitoring and adjusting a predefined gas layer parameter eliminates inadequate heat transfer resulting from excessive gas leakage.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
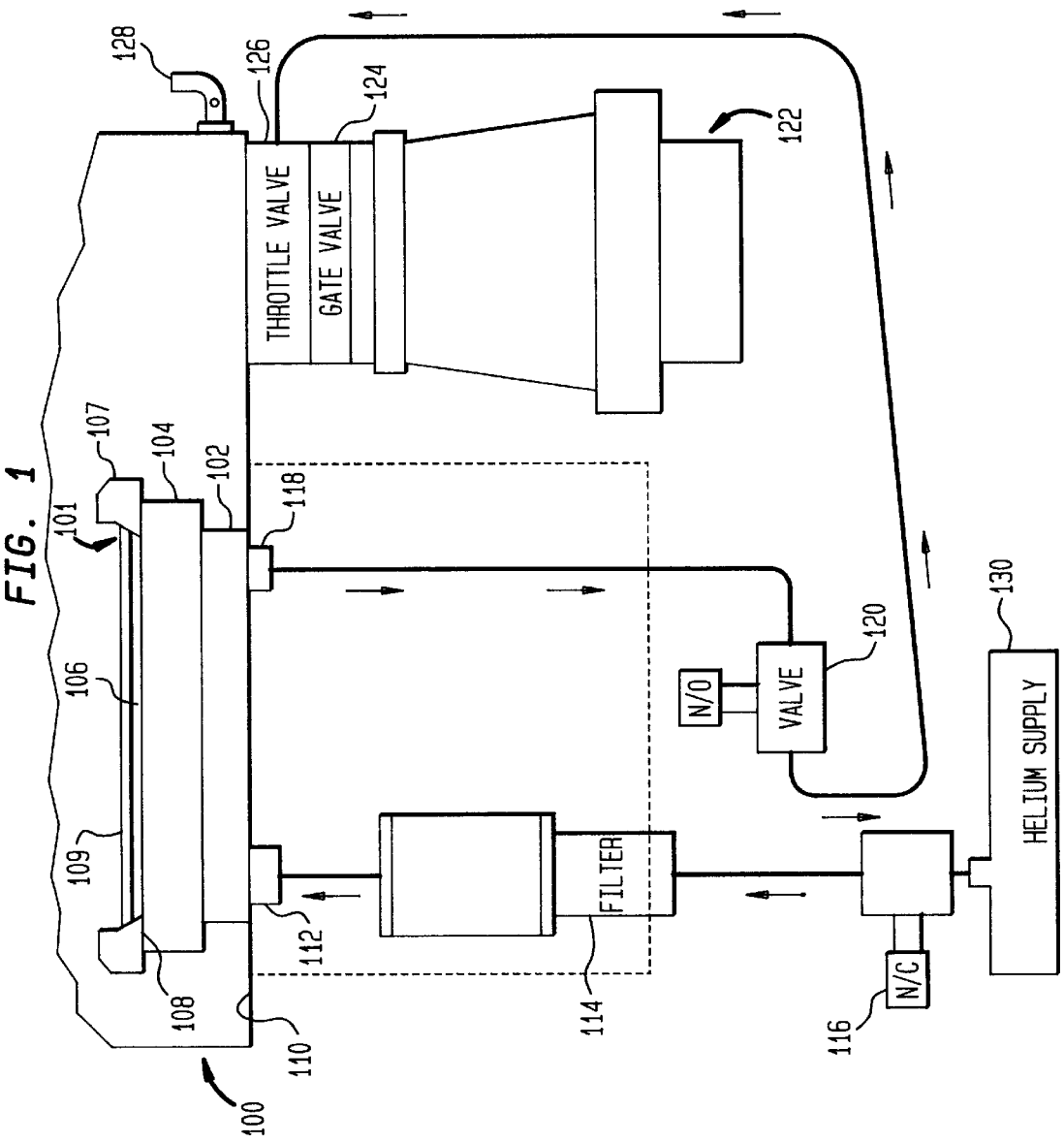
FIG. 1 depicts an elevation view of a bottom portion of a semiconductor wafer processing chamber containing the inventive apparatus.

FIG. 1 depicts an elevation view of a bottom section of a plasma enhanced semiconductor wafer processing chamber 100. For a detailed understanding of the plasma enhanced reaction chamber 100 and its operation in processing a wafer, the reader should refer to the drawings and the detailed description contained in U.S. Pat. No. 4,842,683, issued Jun. 27, 1989 and incorporated herein by reference.

That patent discloses an illustrative biased, plasma etch reaction chamber manufactured by Applied Materials, Inc. of Santa Clara, Calif.

The chamber 100 contains a pedestal assembly 101 containing a pedestal 104, a focus ring 107, and an electrostatic chuck assembly 106. In an illustrative embodiment, the electrostatic chuck assembly 106 is adhered to the top surface 108 of the pedestal 104. The electrostatic chuck assembly 106 is fabricated from a layer of copper sandwiched between two sheets of polyimide (sold under the brandname UPILEX by Rogers). UPILEX is a registered trademark of UBE Industries, Ltd. of Yamaguchi, Japan.

Alternatively, the chuck may be made from ceramic having imbedded electrodes. Also, rather than being separate from the pedestal, the electrostatic chuck assembly 106 can be an integral portion of the pedestal 104. In such a pedestal/electrostatic chuck assembly, the electrode(s) are imbedded in the surface of the pedestal and the pedestal is fabricated of ceramic or some other dielectric material.

Beneath the pedestal assembly 101 and attached to the pedestal 104 above the process chamber floor 110 is a heat transfer gas quick dump collector 102. The collector 102 is provided with a collector inlet port 112 which passes through the chamber floor 110. The collector inlet port 112 is coupled to various plumbing fixtures including a filter 114 and an inlet control valve 116 to connect the collector to an external heat transfer medium supply 130, e.g., Helium supply. The collector 102 is also provided with an collector exhaust port 118 passing through the chamber floor 110 similar to the collector inlet port 112. The collector exhaust port 118 is likewise coupled to plumbing fixtures including an exhaust control valve 120 to connect the collector 102 to a vacuum pump (e.g., a turbomolecular pump 122 (turbo pump)).

The turbo pump 122 is coupled directly to the chamber and develops a high vacuum pressure to establish proper wafer processing conditions in the chamber 100. The turbo pump 122 has a gate valve 124 and throttle valve 126 for monitoring and controlling pressure differences in the chamber 100. Proximate the chamber floor 110, a rough pump inlet 128 is also provided. The inlet is attached to a rough pump (not shown) for conventionally pumping the chamber 100 down to a medium vacuum pressure prior to the turbo pump being actuated to pump the chamber to a high vacuum pressure.

Figure 3:
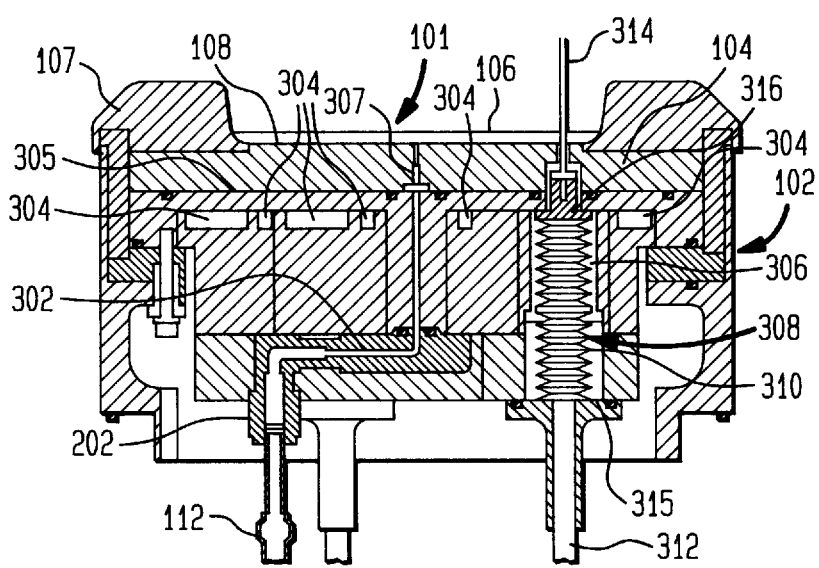
FIG. 3 depicts a detailed cross-sectional view of the inventive apparatus taken along lines 3—3 of FIG. 2.

To achieve cooling of the wafer during processing, a heat transfer gas, preferably Helium, is pumped into the volume created by the interstitial spaces between the wafer 109 and the electrostatic chuck assembly 106. Specifically, the heat transfer gas passes from the supply 130, through the inlet control valve 116, filter 114 and collector inlet port 112 to a coupling 202. The coupling 202 connects the collector inlet port 112 to an "L" shaped bore 302 (see FIG. 3) passing laterally through the collector 102 to the center and then vertically to the top of the collector 305. At the top of the collector 305, a number (e.g., four) of smaller gas distribution ports 204 connect to the end of the bore 302. The ports 204 distribute the heat transfer gas to the surface of the pedestal assembly. The pedestal assembly 101 is provided with an equal number of openings 307 to allow gas from the distribution ports 204 to flow to the backside of the wafer. For additional cooling, the collector 102 is provided with concentrically arranged coolant jackets 304 within the body of the collector 102. A coolant (e.g., water) is circulated through the jackets via a coolant inlet port 208 and a coolant outlet port 210.

The collector 102 is further provided with at least one dual purpose port 206. The dual purpose port 206 extends through the pedestal 104 into a heat transfer gas exhaust cavity 306. An exhaust duct 402 (see FIG. 4) is provided along the sidewall 404 of the gas exhaust cavity 306. The exhaust duct 402 is connected to the collector exhaust port 118.

Figure 2:
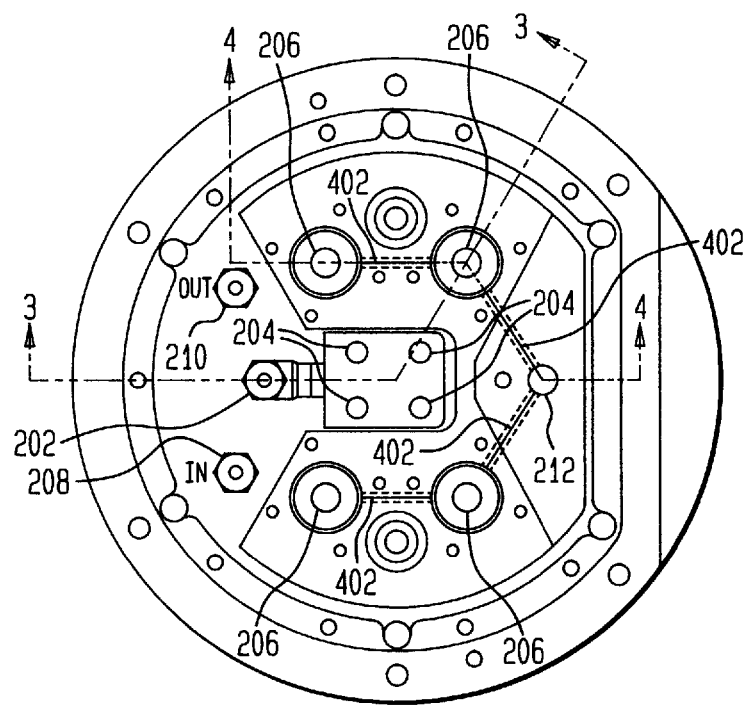
FIG. 2 depicts a bottom view of the inventive apparatus.
Figure 4:
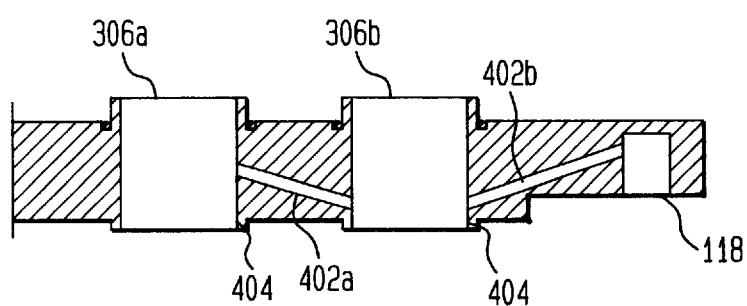
FIG. 4 depicts a detailed cross-sectional view of the inventive apparatus taken along lines 4—4 of FIG. 2.

FIGS. 2 and 4 depict a preferred embodiment of the collector of the subject invention. FIG. 2 depicts a collector 102 having four (4) dual purpose ports 206 positioned radially outward and having slightly larger diameters than the inlet ports 204. Each dual purpose port is connected to a gas exhaust cavity 306 that retains a bellows assembly 308. The bellows assembly 308 contains a pushrod 312 that extends from below the collector 102, through each gas exhaust cavity 306 to a lift pin base 316 at the top of the gas exhaust cavity 306. A lift pin 314 is provided in the lift pin base 316 to lift a wafer from the electrostatic chuck assembly 106 when processing is completed. The portion of the pushrod 312 inside the gas exhaust cavity 306 is sheathed in bellows 310. The bellows 310 are further sealed at the bottom of the gas exhaust cavity 315 and at the lift pin base 316. In effect, each gas exhaust cavity is a bellows cavity which maintains the integrity of the vacuum within the chamber as the lift pins 314 extend from and retract into the pedestal 104 and collector 102. FIG. 4 depicts a cross-sectional view of the collector 102 as seen along lines 4—4 of FIG. 2. Intermediate exhaust duct 402a connects an outer gas exhaust cavity 306a to an inner gas exhaust cavity 306b. A final exhaust duct 402b connects the inner gas exhaust cavity 306b to the collector exhaust port 118. As such, dual purpose ports 206 serve as lift pin access holes as well as heat transfer gas exhaust ports.

The operation of the invention is best described with reference to FIG. 1. A wafer 109 is placed on the electrostatic chuck 106 and the vacuum chamber 100 is sealed. A rough pump (not shown) connected to the rough pump inlet 128 is then activated to pump the chamber 100 to a medium vacuum pressure. At a predetermined vacuum pressure, the gate valve 124, throttle valve 126 and exhaust control valve 120 are opened. The turbomolecular pump 122 pumps the chamber 100 down to a high vacuum pressure for proper wafer processing. At a predetermined high vacuum pressure, the exhaust control valve 120 closes and the inlet control valve 116 opens. Vacuum pressure is thereby cut off from the pedestal and the heat transfer gas is pumped in from the supply 130. Once the gas pressure reaches a specified value, the inlet control valve 116 closes. During processing, the lift pins 314 are retracted and remain below the pedestal surface 108. When processing is completed, a lift pin actuator (not shown) raises the push rods 312 to extend the lift pins 314 through the pedestal surface 108 to engage the wafer. At the same time, the exhaust control valve 120 opens. As such, a high vacuum pressure from the turbo pump 122 draws the heat transfer gas through the dual purpose ports 206, into the heat transfer gas exhaust cavity 306, exhaust ducts 402, and collector exhaust port 118 and off the backside of the wafer 109. As such, a large volume of heat transfer gas can be immediately "dumped" or carried away from the backside of the wafer 109. The arrows in FIG. 1 indicate the direction of the "dumped" gas flow. This results in a rapid decrease in backside gas pressure thereby eliminating the potential for wafer pop-off as the wafer is dechucked. The ports 206 are dual purpose because they provide a quick route for exhausting heat transfer gas as well as providing lift pins 314 access to the pedestal surface 108.

As discussed previously, heat transfer gas leaks at various points where the edge of the wafer contacts the electrostatic chuck assembly 106 during wafer processing. As the heat transfer gas leaks into the chamber, the uniformity of the gas layer is compromised thereby causing non-uniform temperatures across the bottom surface of the wafer.

The present invention also addresses the problem of a non-uniform heat transfer gas layer by facilitating constant control of the gas via the inlet and exhaust valves 116 and 120. Specifically, if the gas layer becomes non-uniform during a process, the inlet control valve 116 is opened to increase the gas pressure beneath the wafer and reestablish layer uniformity. Conversely, if too much gas was initially pumped beneath the wafer, the exhaust control valve 120 is opened. The opening and closing of the inlet and exhaust control valves is accomplished as many times as necessary to maintain the desired heat transfer gas layer uniformity. The opening and closing of the inlet and exhaust control valves is accomplished by a variety of ways. For example, a preset parameter for gas layer uniformity (i.e., density, pressure or the like) can be monitored by a computer controlling the wafer process. If the gas layer deviates from the preset value, the computer sends signals to the valves to open or close according to the existing conditions. Alternatively, the valves are operated manually to allow for customizing gas layer uniformity for optimal temperature control or wafer throughput.

In sum, a volume of space under the pedestal, either previously unused or serving only one purpose (e.g., lift pin conveyance), is exploited for heat transfer gas exhaustion as well. The large volume occupied by lift pin assemblies and the like are connected to a vacuum pump. A large amount of heat transfer gas under the wafer is rapidly "dumped" into this volume via the vacuum pump thereby rapidly reducing backside gas pressure during the critical dechucking stage of wafer processing. The wafer can be quickly and accurately removed from the pedestal without the problem of wafer pop-off. Temperature uniformity is also improved across the wafer since inlet and exhaust lines to and from the volume are provided with separate and independently operable valves. The valves are used to establish an initial heat transfer gas layer. Instantaneous layer variations are corrected by opening or closing the appropriate valve to provide more gas to or remove it from the backside of the wafer. Each of these improvements contribute to greater wafer throughput and chamber utilization.

Although various embodiments which incorporate the teachings of the present invention have been shown and described in detail herein, those skilled in the art can readily devise many other varied embodiments that still incorporate these teachings.

What is claimed is:

1. Apparatus for retaining a workpiece comprising:
   a pedestal assembly for supporting the workpiece, a collector, having at least one gas exhaust cavity containing a bellows assembly, the collector attached to and below the pedestal assembly, for providing gas to interstitial spaces between the workpiece and the pedestal assembly and for rapidly removing said gas from said interstitial spaces; and
   a plurality of valves connected to the collector for regulating gas flow to and from the collector.

2. The apparatus of claim 1 wherein said collector further comprises a plurality of heat transfer gas distribution and dual purpose ports.

3. The apparatus of claim 2 wherein said heat transfer gas distribution ports are connected to a heat transfer gas supply via a bore through the collector, a collector inlet port and an inlet control valve.

4. The apparatus of claim 3 wherein said dual purpose ports are connected to a vacuum pump via said at least one gas exhaust cavity, at least one exhaust duct, a collector exhaust port and an exhaust control valve.

5. The apparatus of claim 4 wherein the gas exhaust cavity is a bellows cavity.

6. The apparatus of claim 5 wherein the bellows cavity are further used for actuating liftpins.

7. Apparatus for exhausting a volume of gas rapidly from a backside of a wafer mounted on a pedestal in a wafer processing system comprising:

a ported assembly attached to and below the pedestal having a top and a bottom, an inlet port on the bottom, an exhaust port on the bottom, a plurality of gas distribution ports on the top connected to a number of openings in the pedestal and connected to the inlet port on the bottom, at least one dual purpose port on the top extending into the pedestal and at least one gas exhaust cavity having a bellows assembly, connecting said at least one dual purpose port to the exhaust port.

8. The apparatus of claim 7 further comprising a vacuum pump connected to the exhaust port via an exhaust control valve.

9. The apparatus of claim 7 wherein the inlet port is connected to a heat transfer gas supply via an inlet control valve.

10. The apparatus of claim 7 wherein the gas exhaust cavity is a bellows cavity containing a lift pin.

11. The apparatus of claim 7 wherein there are four dual purpose ports and four cavities.

* * * * *